US006110217A

United States Patent [19]
Kazmierski et al.

[11] Patent Number: 6,110,217
[45] Date of Patent: *Aug. 29, 2000

[54] SYSTEM AND METHOD FOR SYNCHRONIZATION OF MULTIPLE ANALOG SERVERS ON A SIMULATION BACKPLANE

[75] Inventors: Tomasz Kazmierski, Highfield, United Kingdom; Timothy Michael Kemp, San Jose, Calif.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/943,509

[22] Filed: Oct. 3, 1997

[51] Int. Cl.[7] .................................................. G06F 9/455

[52] U.S. Cl. .............................................................. 703/14

[58] Field of Search ........................ 395/500.06, 500.07, 395/500.08, 500.34, 500.35, 500.36; 364/172

[56] References Cited

U.S. PATENT DOCUMENTS

| | | | |
|---|---|---|---|
| 4,351,025 | 9/1982 | Hall, Jr. ................................. | 364/200 |
| 4,791,593 | 12/1988 | Hennion ................................. | 364/578 |
| 4,792,913 | 12/1988 | Buckland et al. ....................... | 364/602 |
| 4,918,652 | 4/1990 | Bennington et al. ................... | 364/900 |
| 4,985,860 | 1/1991 | Vlach ..................................... | 364/578 |
| 5,157,778 | 10/1992 | Bischoff et al. ........................ | 395/500 |
| 5,297,066 | 3/1994 | Mayes .................................... | 364/578 |
| 5,331,567 | 7/1994 | Gibbons et al. ........................ | 364/481 |
| 5,369,594 | 11/1994 | Huang et al. ........................... | 364/489 |
| 5,617,325 | 4/1997 | Schaefer ................................ | 364/488 |
| 5,629,845 | 5/1997 | Liniger ................................... | 364/172 |

OTHER PUBLICATIONS

Circuit Partitioning and Iteration Scheme for Waveform Relaxation on Multicomputers, Peterson and Mattisson, pp. 570–573, Feb. 1989.

Parallel Event–Driven Waveform Relaxation, Wen, Gallivan and Saleh, pp. 101–104, Mar. 1991.

Improving the Performance of Parallel Relaxation–Based Circuit Simulators, Hung et al., pp. 1762–1774, Nov. 1993.

A. Bose, "Parallel Processing in Dynamic Simulation of Power Systems", Sādhanā, vol. 18, Part 5, Sep. 1993, pp. 815–827.

T. A. Johnson, "Waveform Relaxation Sub–circuit Scheduling That Balances Parallel Processor Workload", *IBM Technical Disclosure Bulletin*, vol. 33, No. 2, Jul. 1990, pp. 270–271.

T. A. Johnson et al., "Parallel Waveform Relaxation Analysis of Circuits with Global Feedback", *IBM Technical Disclosure Bulletin*, vol. 36, No. 1, Jan. 1993, pp. 314–316.

T. A. Johnson et al., "Sub–circuit Partitioning for Fast Gauss–Seidel Waveform Relaxation Circuit Analysis in a Parallel Processing Environment", *IBM Technical Disclosure Bulletin*, vol. 37, No. 7, Jul. 1994, pp. 199–202.

F. M. Odeh et al., "Adaptive Waveform Relaxation Algorithm", *IBM Technical Disclosure Bulletin*, vol. 27, No. 1B, Jun. 1984, pp. 708–709.

(List continued on next page.)

*Primary Examiner*—Kevin J. Teska
*Assistant Examiner*—Dan Fiul
*Attorney, Agent, or Firm*—Altera Law Group, LLC

[57] ABSTRACT

A multiprocessor system and method are provided for simulating electrical circuits. The circuit is divided into portions, and separate simulator modules perform a multi-rate behavior simulation, to simulate the performance of respective circuit portions. The simulator modules communicate using block waveform relaxation. Accordingly, the amount of inter-process communication is advantageously low, and the need for backing up digital simulation processes is avoided, providing advantageously fast performance. A system according to the invention is preferably implemented, either physically or logically, in a simulation backplane configuration, having a common connective bus structure, to which multiple active simulation modules are coupled through an interface which is standardized for facilitating block waveform relaxation.

14 Claims, 7 Drawing Sheets

OTHER PUBLICATIONS

D. W. Smart et al., "Waveform Relaxation on Parallel Processors", *International Journal of Circuit Theory and Applications*, vol. 16, Jun. 1988, pp. 447–456.

J. White et al., "Accelerating Relaxation Algorithms for Circuit Simulation Using Waveform Newton, Iterative Step Size Refinement, and Parallel Techniques", *IEEE International Conference on Computer–aided Design*, ICCAD–85, Nov. 18–21, 1985.

solver 1 solver 2 solver 3

*Fig. 7* m:=0 forall $i \in \{1,...N\}$ guess the local waveforms $v_i^0(t)$    $t \in [t_k, t_{k+1}]$ repeat m:=m+1 forall $i \in \{1,...,N\}$    { solve for    $v_i^m(t)$    $t \in [t_k, t_{k+1}]$ $$\frac{d}{dt}\left[q_i(v_i(t), v_{q_i}(t)) + \frac{\partial q_i}{\partial v_i}(v_i^m(t) - v_i^{m-1}(t))\right] + f_i(v_i(t), v_{q_i}(t), u_i(t)) + \frac{\partial f_i}{\partial v_i}(v_i^m(t) - v_i^{m-1}(t)) = 0$$

} until $\max_{i \in \{1,...,N\}} \max_{t \in [t_k, t_{k+1}]} \|v_i^m(t) - v_i^{m-1}(t)\| < \varepsilon$

SYSTEM AND METHOD FOR SYNCHRONIZATION OF MULTIPLE ANALOG SERVERS ON A SIMULATION BACKPLANE

FIELD OF THE INVENTION

The invention generally relates to the field of systems, such as electronic apparatus, configured as having a standardized, relatively neutral and inactive, interface coupled between active components. More specifically, the invention relates to the task of synchronizing concurrent activities performed by respective ones of such active components. The invention has particular applicability to analog simulation, as it applies to such electronic apparatus.

BACKGROUND OF THE INVENTION

The invention relates to electronic apparatus having a common backplane which includes connectors for coupling to active modules implemented on circuit boards with edge connectors. In particular, electronic circuits may be simulated using such an architecture.

Note, at this point, that the discussion which follows will concern itself both with (i) physically implemented electronic circuitry, making up active modules (such as simulation modules) on circuit boards, and (ii) "logical" or "virtual" circuits whose simulation is the objective of the physical circuits. It is believed that, with this distinction in mind, the reader of this patent application will be able to tell, from the context, which circuit is being referred to at any given point. However, where further emphasis of this distinction is deemed necessary for clarity, terminology such as that just given will be used.

Where a circuit (a logical circuit, that is) is to be simulated, it has been conventional practice to partition the circuit into portions, and to use different simulator modules (physical circuitry) to simulate respective ones of the portions of the circuit.

The term "backplane" is conventionally used to refer to any structure for interconnecting the modules. More specifically, a "simulation backplane" is used for interconnecting simulator modules.

Sometimes, but not necessarily, the simulator system pay be physically configured as a set of simulator modules, on respective circuit boards, commonly housed in a chassis having a physical backplane structure for interconnecting the simulator boards. Where this sort of physical structure is not used, it is nevertheless common practice to use the term "simulation backplane" in a metaphorical sense. For the purpose of the present patent application, the term "simulation backplane," or the like, is construed broadly to cover all usage, physical, literal, or otherwise, which would be understood by a person skilled in the art.

A simulation backplane is essentially a parallel processing framework, where several simulators can concurrently solve a partitioned design. An example of a partitioned design is an electronic circuit design. The circuit is divided into portions, or modules. Thus, points or nodes which are on the interior of the overall circuit will, in some cases, be interface points between different portions of the circuit.

In a simulation backplane, each active module is assigned a portion of a partitioned design problem. The term "solver" will be used herein, to denote a process which may run on a processor, and which performs the simulation calculation of a portion of a partitioned design. Thus, a simulation backplane is typically comprised of a plurality of such processors, each running a respective solver process to perform simulation calculations for a respective portion of the partitioned design.

Each of the simulators may use a different level of modeling abstraction and time granularity.

Associated with the backplane, there is a synchronizing algorithm responsible for managing the progress of each solver, and for communicating the calculated waveforms. Synchronization, or integration, of the operations of the different simulators is an important part of the task of simulator system.

Toward this end, a key goal in simulation backplane technology is to reduce the cost of integration of proprietary simulation engines and utility tools to the benefit of both CAD (computer-aided design) vendors and circuit designers. Efforts have been made to develop a standard Application Programming Interface (API) that can be used in coordinating multiple simulators (digital, analog, and mixed signal) in a unified way.

One of the most difficult issues in this regard is the coupling of analog simulators which use a variety of different modeling techniques and disparate numerical solution models. To be useful, parallel processing must allow for a certain amount of cooperation and communication between processors, or else the system is merely an aggregation of independent processors.

A conventional processing architecture has included a plurality of processors and a communication manager, coupled between the processors to provide the results from one processor to another processor whose task requires having those results. A communication manager allows a first simulator to run until it reaches a given state, and then to pass that state on to a second simulator.

An example of such a parallel processor architecture for performing circuit simulation is given in Bischoff et al., U.S. Pat. No. 5,157,778, "Method and Apparatus for Circuit Simulation Using Parallel Processors Including Memory Arrangements and Matrix Decomposition Synchronization." That patent provides a description of a matrix structure for storing preliminary process data and results of calculations, thus providing access, by the processors, to the data without requiring a locking mechanism. Note, however, that data must be calculated by one processor before it can be passed, through the matrix, to another processor.

The Bischoff system, which involves a communication manager that simply allows one simulator to pass its state to a second simulator, produces results which are undesirably low in accuracy, and which may even be incorrect.

Another conventional approach is given in Vlach, U.S. Pat. No. 4,985,860, "Mixed-Mode-Simulation Interface." The Vlach patent describes a mixed-mode simulator, in which analog and digital portions of a simulator are synchronized. The Background section of the Vlach patent summarizes a conventional synchronization technique of making discrete time steps in a jointly determined, lockstep fashion. Vlach then presents his inventive system, in which a simulator has an analog portion and an event-driven portion. The analog portion runs the simulation until a threshold-crossing event occurs. That simulation is run based on polynomial interpolation. Vlach characterizes this as "'peeking' at the future."

Then, the event-driven portion operates on a step size determined from the threshold-crossing event. Vlach characterizes this portion as a "time rollback," in which the event-driven simulation is "always catching up" to the next time point.

The Vlach system, accordingly, takes less than optimal advantage of the efficiency which parallel processing potentially can provide, because of the added processing time consumed in the peeking, rolling back, and catching up.

Therefore, there remains an unfulfilled need for new, creative approaches to parallel simulator architecture, which will overcome these drawbacks to provide greater accuracy and efficiency.

SUMMARY OF THE INVENTION

It is therefore an object of the invention to provide a parallel processing system for circuit simulation which provides improved accuracy and efficiency.

To achieve this and other objects, there is provided in accordance with the invention a multitasking system for simulation the behavior of an electronic circuit. The system comprises the following components:

First, means are provided for partitioning the electronic circuit to be simulated into portions.

An interface module is provided, having a standard interface for coupling with active components and for facilitating communication, by block waveform relaxation, between different ones of the active components.

A plurality of active components are provided, coupled to the interface module, each of the active components including means for performing a simulation of a respective one of the portions of the circuit to be simulated, and means for communicating simulation status by block waveform relaxation.

A system according to the invention provides a new approach to synchronizing analog simulators in a multiple solver backplane environment. A simulation backplane is essentially a framework where several simulators can concurrently solve a partitioned design with each using a different level of modeling abstraction and time granularity. Associated with the backplane, there is a synchronizing algorithm responsible for managing the progress of each solver and communicating the calculated waveforms.

A noteworthy objective of a simulation backplane according to the invention is to reduce the cost of integration of proprietary simulation engines and utility tools to the benefit of both CAD vendors and circuit designers. To this end, a particular challenge is the coupling of analog simulators as they use a variety of modeling techniques and disparate numerical solution methods. This challenge is met by means of a block waveform relaxation based algorithm that can synchronize concurrently executing analog solvers.

The invention achieves cost reduction of integration of simulation engines and utility programs, and of program development of a multi-simulator environment. Accuracy of the answers from the simulation environment is improved. The performance of a system simulation is improved through parallel processing.

As described below, the invention is well suited to multi-process systems where the efficiency of inter-process communications (IPC) is of paramount importance.

The invention is primarily disclosed herein as a method or system. It will be understood by a person of ordinary skill in the art that an apparatus, such as a conventional data processor, including a CPU, memory, I/O, program storage, a connecting bus, and other appropriate components, could be programmed or otherwise designed to facilitate the practice of the method of the invention. Such a processor would include appropriate program means for executing the method of the invention.

Also, an article of manufacture, such as a pre-recorded disk or other similar computer program product, for use with a data processing system, could include a storage medium and program means recorded thereon for directing the data processing system to facilitate the practice of the method of the invention. It will be understood that such apparatus and articles of manufacture also fall within the spirit and scope of the invention.

BRIEF DESCRIPTION OF THE DRAWINGS

FIG. 7 is a pseudocode representation of a waveform relaxation algorithm to be practiced by a system according to the invention.

DESCRIPTION OF THE PREFERRED EMBODIMENT

Description of a System According to the Invention

A basic, block-diagram-level description of the invention will now be given, in connection with FIGS. 1 and 2.

Figure 1:
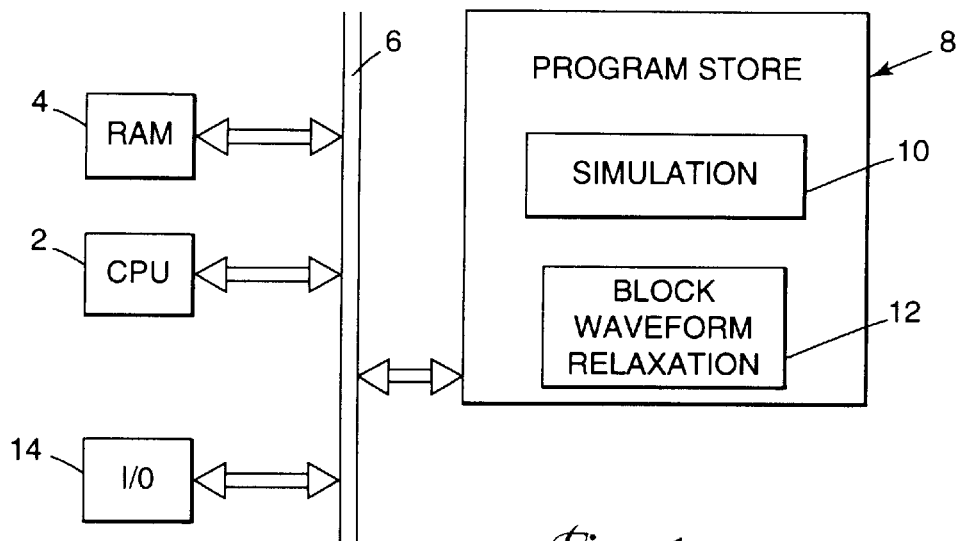
FIG. 1 is a block diagram of a computer apparatus according to the invention.

FIG. 1 is a block diagram of a computer system for practicing the method of the invention. A CPU 2, supported by RAM 4, is coupled to an internal communication bus 6. Also coupled to the bus 6 is a program store 8 containing computer program means 10 for performing a circuit simulation, and computer program means 12 for communicating between simulator modules, shown as block waveform relaxation means. An I/O interface module 14, suitable for use with the communication computer program means 12, is also provided.

Figure 2:
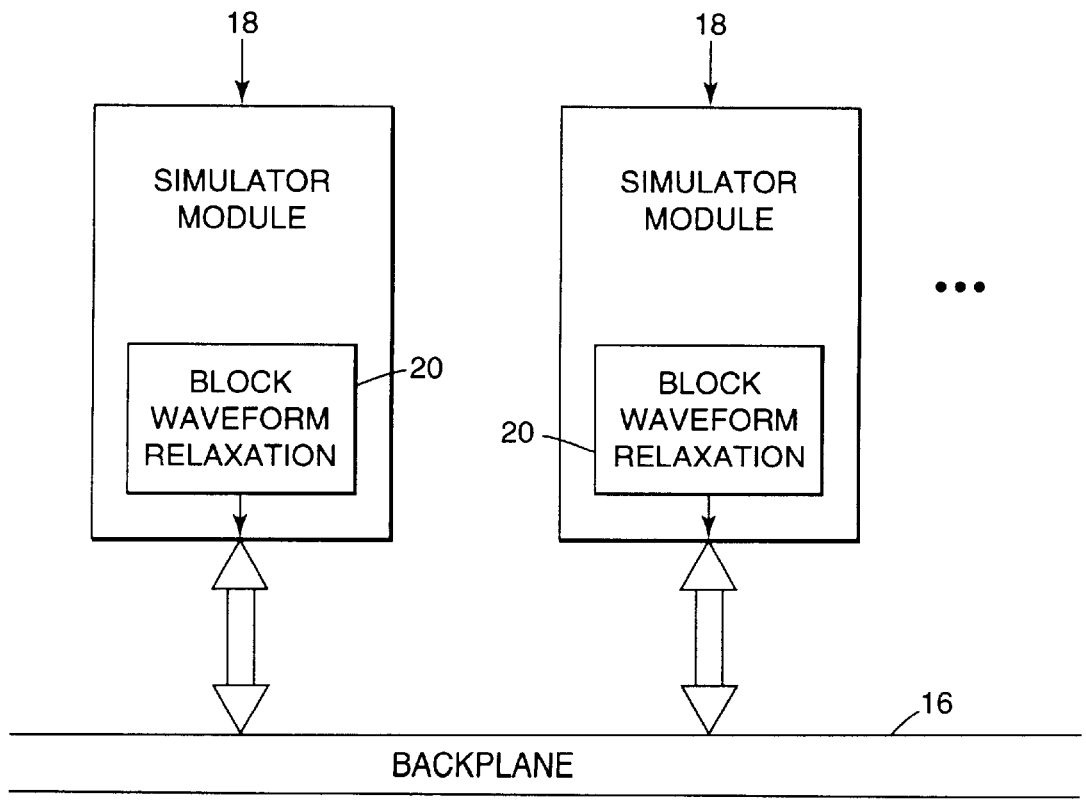
FIG. 2 is a block diagram of a system according to the invention.

FIG. 2 is a larger-scale system block diagram of a system according to the invention. FIG. 2 is shown as a physical implementation of the simulation backplane architecture of the invention. An interface module, shown as a backplane 16, provides a common communication medium having a standard interface. A plurality of simulator modules 18 are coupled to the backplane 16. In this implementation, each simulator 18 is substantially as shown in FIG. 1, containing a communication module 20, such as a block waveform relaxation module, implemented by execution of the block waveform relaxation code 12 by the CPU 2.

Alternatively, the invention may be implemented, substantially in its entirety, as a single computer system, substantially as shown in FIG. 1. In such an implementation, the CPU 2 executes multiple processes of the simulation and the block waveform relaxation, as per the program means 10 and 12, and employs a suitable internal software arrangement, such as by a known caching technique, for passing information between the simulation processes.
Simulation of an Exemplary Circuit Next, a description will be given of how a system as described above performs a simulation of a circuit.

Figure 3:
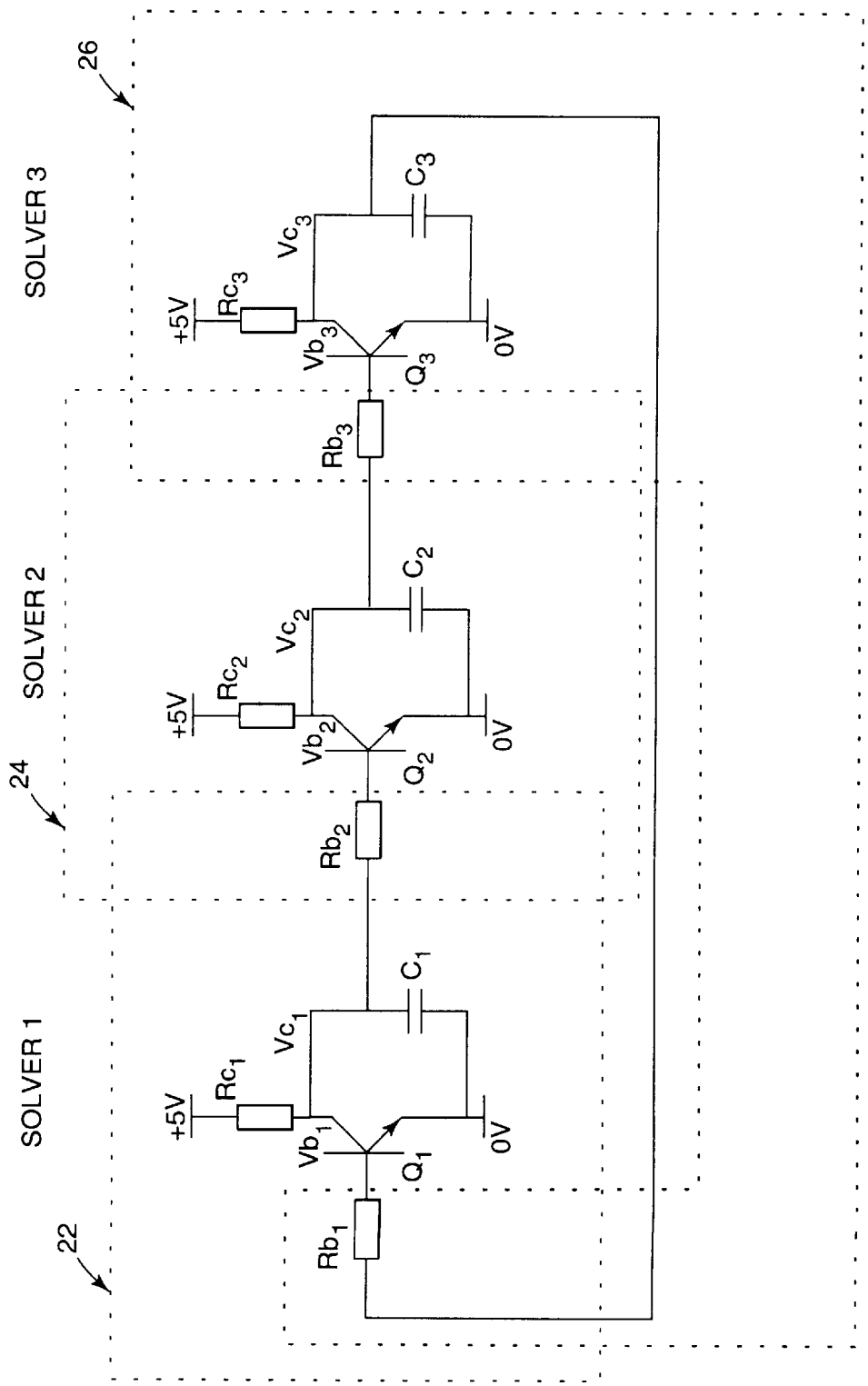
FIG. 3 is a schematic diagram of a circuit to be simulated by a system according to the invention.

FIG. 3 is a schematic circuit diagram of a bipolar junction transistor (BJT) ring oscillator. The circuit may readily be partitioned into three stages, generally shown as 22, 24, and 26.

The three stages are coupled, the output of each stage to the input of the next stage, the output of the third stage 26 looping back to the input of the first stage 22.

Figure 4:
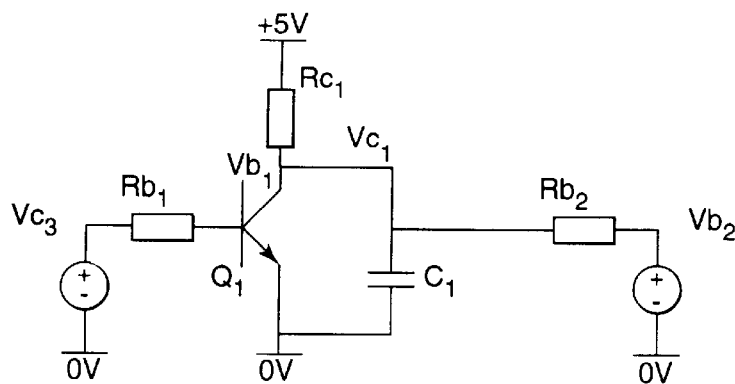
FIGS. 4, 5, and 6 are schematic diagrams of portions of the circuit of FIG. 1, as partitioned according to the invention.
Figure 5:
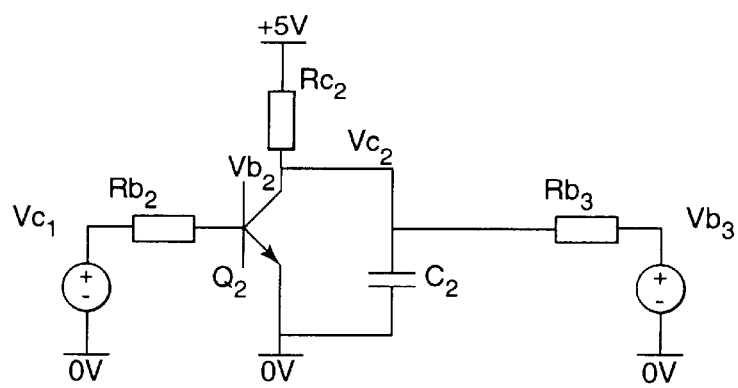
Figure 6:
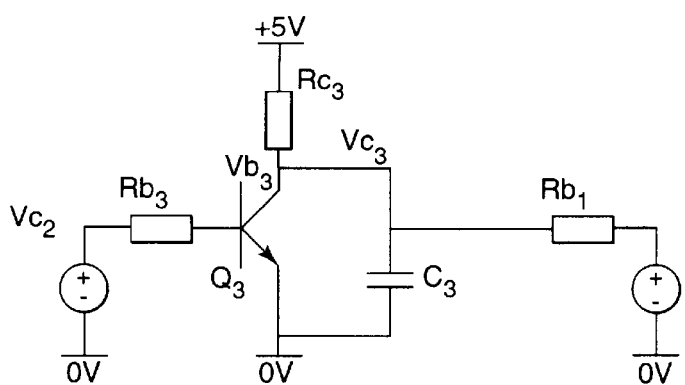

Simulation of this circuit may be effected by use of three analog solvers, by partitioning the circuit into its three distinct stages, and by assigning one state to each respective one of the solvers. The result of the partitioning and assigning is shown in FIGS. 4, 5, and 6. The legends "Solver 1," "Solver 2," and "Solver 3" are used in FIGS. 3, 4, 5, and 6 to more clearly illustrate the portions of the circuit of FIG. 3 and how they are to be simulated.

Each of the solvers has a voltage input and a voltage output whose names are reflective of the points, on the other stages, to which they are coupled. For instance, the input voltage of the solver 1 stage is designated "$Vc_3$" and is coupled (albeit through a resistor $Rb_1$) to the collector voltage $Vc_3$ of the third stage's transistor $Q_3$.

For the discussion which follows, the term "global net" will be used to refer to a net shared by two or more partitions. Thus, the multiple-solver system just described in terms of FIGS. 3, 4, 5, and 6 is an example of a global net.

Theoretical Basis for Simulation

Let us now digress, briefly, to provide a theoretical basis for what follows.

Initially, it will be understood that simulation of an analog system, such as an analog circuit, is done generally by modeling the circuit and simulating analog waveforms. The circuit is modeled in terms of its components and of nodes between the components, including inputs and outputs. When the circuit is partitioned, internal nodes become input or output nodes of the separate portions.

To run the simulation, input waveforms are received, and the simulation generates resultant waveforms at various component nodes of the circuit. In the discussion which follows, the input waveforms are also referred to as "stimulus," and the resultant waveforms are referred to as "unknown" waveforms, i.e., waveforms to be calculated by the simulation. "Global net" waveforms denotes waveforms provided between partitions, i.e., waveforms that are internal to the overall circuit, but which are visible at interfaces between partitions.

Where an analog system is partitioned into N blocks, a general expression, such as the following exemplary expression, is derived, based on the mathematical equations that describe the particular circuitry. Such general expressions are derived on a per-partition basis. The equations for a given partition form the basis for a simulation model of the respective portion of the circuitry. The simulation model is derived, in the form of executable computer software, for use by the simulator module in simulating the performance of the portion of the circuitry. Input signals (also called "waveforms" herein) are provided, and signals internal to the portion of the circuitry, as well as signals to be provided at outputs or partition interface points, are generated by the simulation.

In the case of the circuitry of FIGS. 3, 4, 5, and 6, the circuitry is characterized primarily by capacitors. Also, capacitances between the collector and emitter of the transistors shown are modeled. Accordingly, for the particular circuit illustrated, the expression is based on the charge on the capacitors, and on current flow into the capacitors.

In particular, for the circuitry of FIGS. 3, 4, 5, and 6, the following expression holds, for a partition index $i=1, \ldots, N$, over a time interval $t \in [0,T]$:

$$\frac{\partial}{\partial t} q_i(v_i(t), v_{qi}(t)) + f_i(v_i(t), v_{qi}(t), u_i(t)) = 0$$

In this expression, v(t) generally represents waveforms. In particular, $v_i(t)$ represents the unknown waveform at the i-th partition, and v(0), the value of the waveforms at time 0 being equal to an initial value $V_0$. The term $v_{qi}(t)$ represents the global net waveform at the i-th partition. The expression $u_i(t)$ is a stimulus at the i-th partition.

If this equation arises from a nodal formation, such as that given in FIGS. 3–6, then $q_i$ represents the sum of the charges at the capacitors connected to the i-th node, $f_i$ is the current charging the capacitor at the i-th node, and $v_i$ is the nodal voltage. Thus the equation may be paraphrased in language as a statement that the change in charge on the capacitors (the time derivative of q) is equal in magnitude to the current f charging the capacitors.

For other types of circuits, other characterizing equations will be known to skilled circuit designers. Such other equations will then form the basis for simulation of those other circuits, in the same manner described here.

Note, however, that the equation given above is not specific to nodal circuitry. Rather, equations substantially similar to that given above may be useful for modeling a wide variety of circuits. For instance, the symbol q in the first term of the equation could represent any energy storage quantities such as charges or fluxes, and v(t) can represent both voltages and currents. The equation given is not the most general type of nonlinear differential equation, but is sufficient to describe most networked analog systems, including non-electrical systems.

Equations as given above, each equation representing a respective one of the nodes, are solved, preferably simultaneously and by a SPICE-like solver using a direct method. SPICE (Simulation Program with Integrated Circuit Emphasis) is a widely-used circuit simulation program. It was developed as public domain software at the University of California. Versions 2G6 (vanilla SPICE) and 3.0 are still used.

Further, a solution of the global equation set may be obtained by block relaxation. In a mixed-signal environment, analog solvers interact with each other, as well as with digital solvers, in order to send or receive waveforms or events.

Solver-to-solver communication occurs at discrete time points. For instance, in a time interval [0,T], communication time points may be represented as $t=0, t_1, \ldots, t_k, t_{k+1}, \ldots, T$.

In accordance with the invention, a "parallel Gauss-Jacobi waveform Newton" (PGJWN) algorithm is executed, for each backplane time window $t \in [t_k, t_{k+1}]$.

A Preferred Implementation (FIG. 7)

Referring now to the pseudocode of FIG. 7, there is shown a pseudocode implementation of a preferred algorithm to be executed for simulation of a system of N partitions for a time window $t=[t_k, t_{k+1}]$. The algorithm may be briefly summarized in words, as follows.

First, the relaxation iteration index m is initialized to 0, and the unknown local waveforms are set to their initial guess values.

The parallel Block-Gauss-Jacobi-Waveform-Newton iteration loop is executed, repeatedly, until the iterations converge. A local waveform $v_i^m(t)$ is a waveform for the i-th partition for an m-th relaxation iteration. In each iteration, new values of the unknown local waveforms are calculated by solving the local equation set. The calculations are preferably done using either a direct method, such as LU factorization or Gauss elimination, or, alternatively, a local relaxation method. For each time window, there will be executed a sufficient number of relaxation iterations to satisfy the "until" condition.

The values of external global net waveforms used at each iteration are those obtained from other partitions at the previous iteration.

In multiprocess implementations of the backplane, global net waveforms are communicated between the partitions by means of inter-process communication (IPC) messages. Single process (i.e., linked-in) implementations employ an equivalent message passing mechanism.

Convergence preferably is tested by comparing the new local waveform values with those calculated at the previous iteration. The iterations converge when the difference between the two waveforms becomes sufficiently small.

The number of IPC messages per waveform, in each time window, is equal to the number of relaxation iterations. At the end of execution of the pseudocode in FIG. 7, the relaxation iteration index variable m provides that number.

Retro-Events and Synchronization

After the backplane has issued a call to evaluate the waveforms v(t) at the time window $t \in [t_k, t_{k+1}]$, new events, retro-events, may be generated within the window as a result of the interaction between the solvers. It is sometimes necessary for a simulator module to backtrack and generate retro-events, i.e., extra intermediate events between simulation time points. Retro-events that propagate through global nets can affect the simulation results at other solvers. Accordingly, the system according to the invention includes means for allowing a simulation module to deal appropriately with retro-events generated at other simulation modules.

Figure 8:
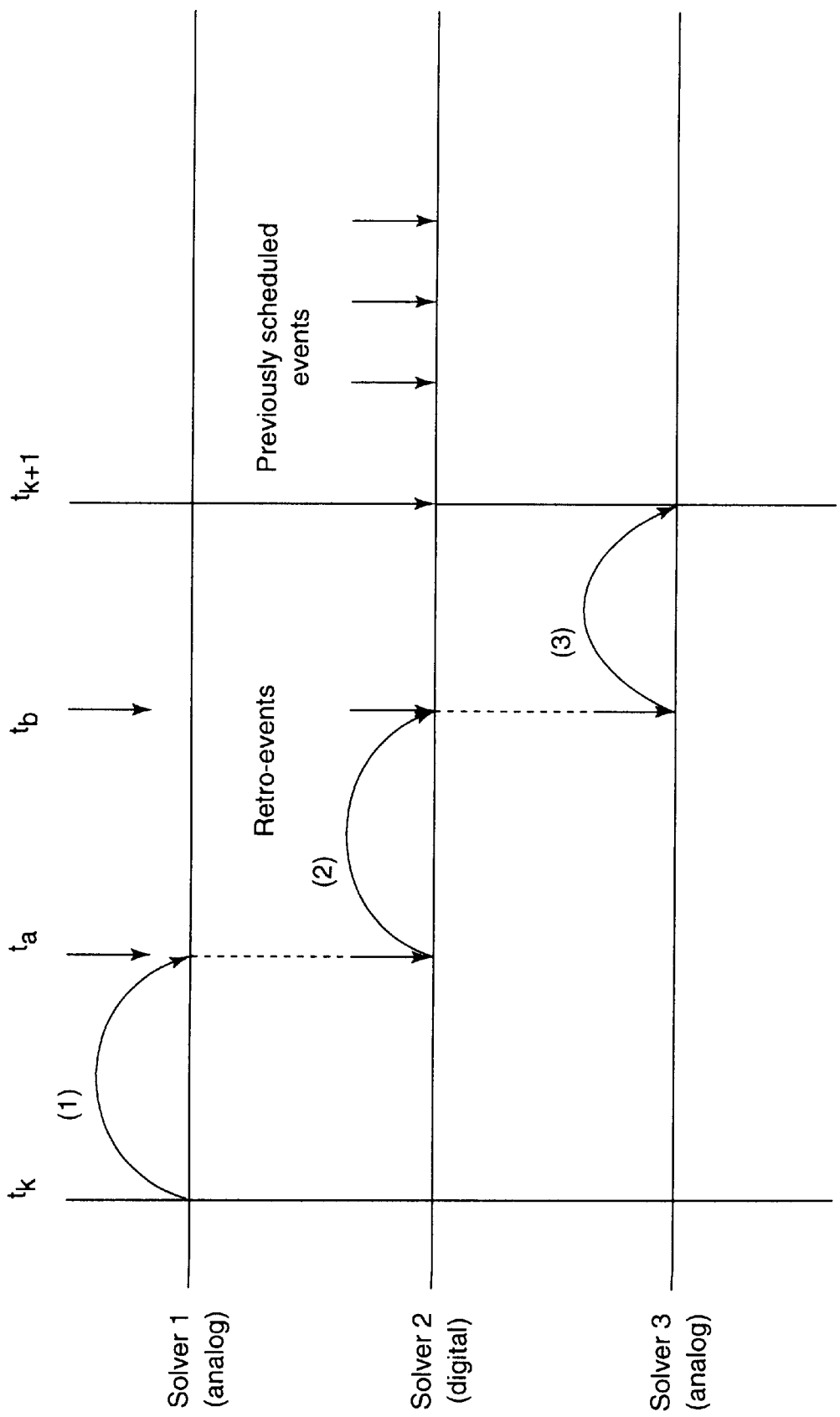
FIG. 8 is a timing diagram showing generation of retro-events according to the invention.

An example of such retro-event generation, shown in the timing diagram of FIG. 8, illustrates how retro events can occur. Three solvers, of which two are analog and one is digital, run within the time window $t \in [t_k, t_{k+1}]$, where time moves forward from $t_k$ to $t_{k+1}$.

Initially, all solvers have reached the time point $t_k$, and the next global event is scheduled to occur at time point $t_{k+1}$.

While an analog solver calculates the waveforms at $t_{k+1}$, it is possible that it might need to backtrack and generate retro-events, i.e., extra events after time point $t_k$ and before time point $t_{k+1}$. Retro-events that propagate through global nets can affect the simulation results at other solvers.

Some solvers, such as the digital solvers, may not be capable of backtracking. It is therefore necessary to assure that the synchronization algorithm will not permit non-backtracking solvers to run beyond the earliest time point after which retro-events might still occur.

The example shows two retro-events at intermediate times $t_a$ and $t_b$.

Solver 2 (digital, non-backtracking) waits at time $t_k$, in anticipation of retro-events, until the analog solvers calculate the solution at $t_{k+1}$.

Firstly, Solver 1 (analog) generates the retro-event $t_a$, which causes a change in a global net that links Solver 1 with Solver 2 (digital).

This in turn causes Solver 2 to generate a second retro-event at time point $t_b$, which propagates to Solver 3 (analog).

As a result, Solver 3 must re-run from time point $t_b$ to time point $t_{k+1}$. The PGJWN algorithm needs to be re-run in the time window $t \in [t_b, t_{k+1}]$ in order to correct the analog waveforms.

"Ownership" of Global Nets by Solvers

The PGJWN algorithm implies that each global net (i.e. a net linking two partitions) should have one owner. That owner should be either an analog or a digital solver. The owner is responsible for resolving the net, and for providing the calculated waveform to the other solvers.

This approach, in which responsibilities are delegated to owners, enables a unified treatment of both analog-to-analog and digital-to-digital communication. Digital-to-analog (or analog-to-digital) communication can be reduced to a digital-to-digital one by providing some D-A or A-D translation within analog partitions.

In the example in FIGS. 3–6, the BJT ring oscillator circuit is partitioned between three analog solvers where Vb1, Vc1, Vb2, Vc2, Vb3 and Vc3 are global nets. For the purpose of the PGJWN algorithm, the partitioned circuit can be presented in modules, designated as "Solver 1" through "Solver 3," as shown in FIGS. 4–6. Solver 1, for instance, owns the net Vc1 and sends the calculated waveform to Solver 2. Similarly, the waveform on the net Vb2 is calculated by Solver 2 and transmitted to Solver 1, etc.

An interesting point to note is that, in order to calculate the waveform at a net, (also referred to as "resolving" the net), the owning solver must know the models of all components connected to that net. For instance, the resistance Rb2 in the example of FIG. 3 must be known to both Solver 1 and Solver 2, in order to resolve Vc1 and Vb2. Therefore, the partitioning algorithm can request that both solvers create an instance of the shared component and build its model independently. As a result, there is no communication overhead at simulation time.

If the circuit equations at the partitions are decoupled, and convergence on global nets is sought by some form of relaxation, then the partitioned circuits can be presented as shown in FIGS. 4, 5, and 6. For example, Solver 1 owns the net Vc1 and sends the calculated waveform to Solver 2, according to an established waveform communication protocol.

Similarly, the waveform on the net Vb2 is calculated by Solver 2 and transmitted to Solver 1 and so on.

Classical point relaxation or waveform relaxation of Gauss-Seidel or Gauss-Jacobi type requires usually several iterations at the same time point or time window before a convergence is reached. This is similar to delta cycles (in VHDL sense) in digital simulation, and, hence, it is probably safe to assume that the underlying synchronizer will be able to perform several solver-to-solver communication cycles before the time can be moved ahead.

Alternatively, at each communication cycle, one of the solvers can evaluate the component model and then send it to the solvers that share it. The former method requires less communication overhead while the latter does not duplicate the effort of building the model. Also in digital partitions, it might be necessary for the resolving solver to know some attributes of a remote driver which is connected to a global net. The resolving solver might therefore recreate the model of that driver, or alternatively, ask the backplane to provide driver's attributes at simulation time. It is proposed that the backplane support both methods so that the simulator integrator can make a choice.

Another point to note is that the data type of the waveform on an analog global net is common for all the partitions that use it. The backplane should support several standard waveform types, and the integrators will be responsible for providing the necessary translations.

Similar problems exist in digital-to-digital communication. For example, a VHDL resolution function must have a single input parameter that is a one-dimensional unconstrained array whose element type is that of the resolved signal. The type of the return value of that function is also that of the signal.

Each time a resolution function is invoked, it is passed an array value. Each element of the array value is determined by a corresponding source of that signal.

Figure 9:
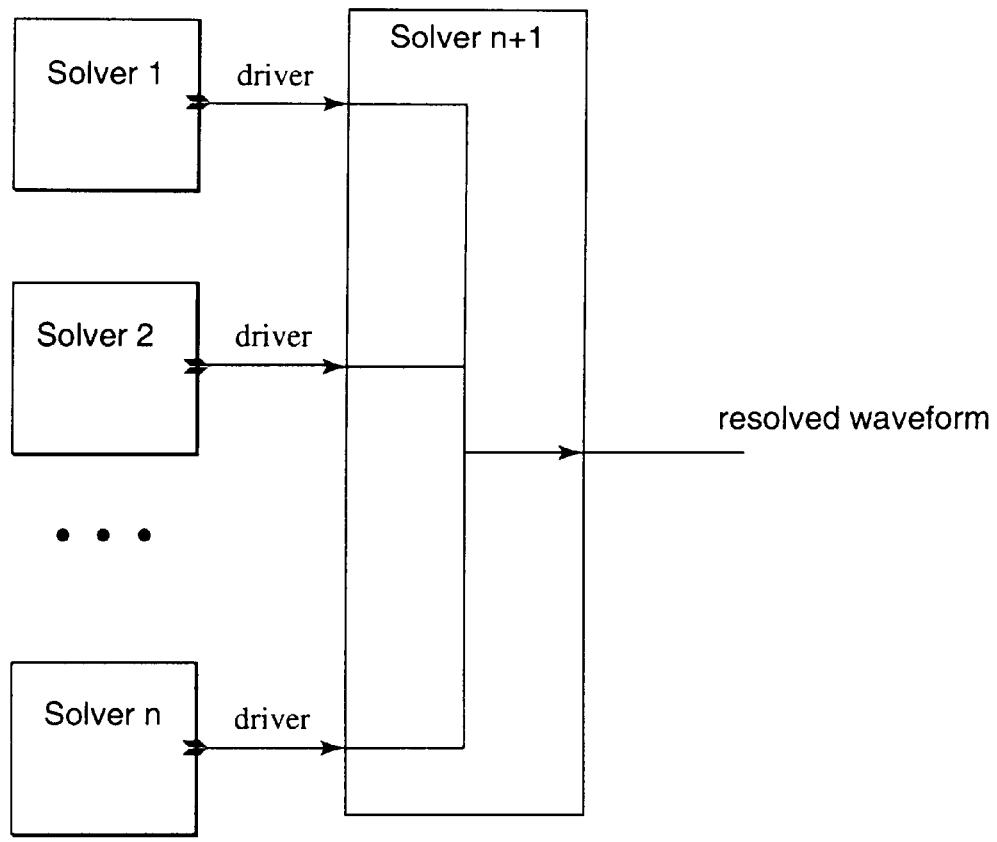
FIG. 9 is a drawing of how a solver may be used to resolve a multiply driven net.

The communication scheme on a multiply driven global net can be presented as shown in FIG. 9. Remote drivers may use different data types to represent their waveforms. Those different data types are cast into the data type of the resolving solver before the resolution function is called.

Waveform Resolution Scenario

Next there will be presented a detailed description of an application programming interface (API) implementation of the invention. For background information, see http://www.cfi.org for information about the Backplane Working Group, a project of the CAD Frame Initiative, now called the Silicon Integration Initiative, an industry standards consortium.

What follows is a description of a waveform resolution API, which is part of the solver integration API.

Figure 10:
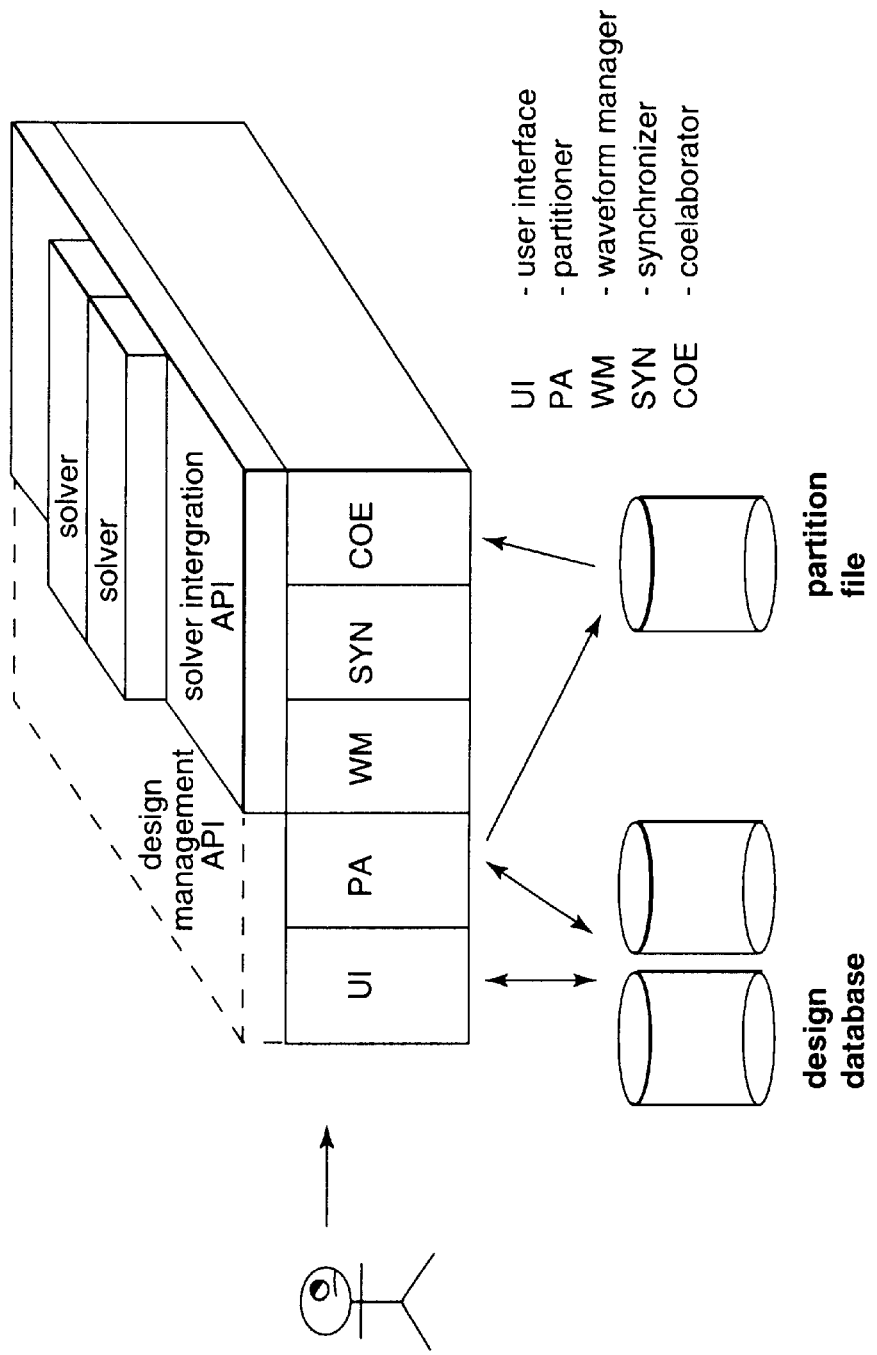
FIG. 10 is a block structure diagram of a design system according to the invention, using a backplane for linking solvers.

The diagram in FIG. 10 shows the relationship between the solver integration API and the other parts of the backplane, including a coelaborator (COE), a synchronizer (SYN), and a partitioner (PA).

The details of how the partitioner creates information about global nets, their ownership, and their drivers are not essential to the invention, and are left to the discretion of the system designer.

However, it is assumed here that the partitioner, in collaboration with the user interface (UI), will generate a partition data file whose format is understood by the coelaborator. The coelaborator (COE) can use the data in the partition file to issue suitable function calls to the solvers, so that they can register global ports, nets and remote drivers of multiply driven nets.

The synchronizer (SYN) is responsible for controlling the waveform communication between the solvers at simulation time. The owning solver of each global net will broadcast the waveform on that net to the solvers that use it.

It is important to stress here that global net ownership, and, hence, the direction of message transmission across API, is not related with port direction (i.e. in, out and inout). For instance, analog nets have no notion of port direction, as they can be driven by many remote components, and API messages with waveform values are always originated by the owning solver.

Similarly, the fact that a digital solver is driving a net via an output port does not necessarily determine the direction of API messages concerning that net as the net may belong to another solver.

The diagram in FIG. 9 illustrates the problem of multiply-driven net ownership.

The API functions relevant to waveform resolution can roughly be divided into the following categories:
 coelaborator calls to the solvers; these calls occur at elaboration phase and concern registration of global nets, ports and drivers,
 solver calls to the coelaborator; on occasions, solvers will call back the coelaborator in order to report errors,
 synchronizer calls to the solvers; these calls are made at simulation time to initiate waveform transfer,
 solver calls to the synchronizer; solvers use these calls for waveform transmission and error reports.

The above API functions are listed below, in the section titled "WAVEFORM RESOLUTION API FUNCTION CALLS" (see below). The function names, beginning with the prefix 'bp', denote backplane (i.e. coelaborator or synchronizer) calls to the solvers, and the names beginning with the prefix 'ss' are functions used by the solvers to call the backplane.

Data Types

The following is the minimum set of standard data types needed for waveform communication:
 bpBitT
 bpBitVectorT
 bpMVLogicT (standard multivalued logic type as defined by IEEE 1154)
 bpMVLogicVectorT
 bpByteT
 bpBooleanT
 bpCharT
 bpStringT
 bpIntegerT
 bpFloatT
 bpFloatVectorT
 bpDoubleT
 bpDoubleVectorT
 bpObjectIdentT (a structure used to communicate identifiers and attributes of drivers, cells, components and other objects which can be connected to global nets).

In addition there is a standard data type to represent time:
 bpTimeT

This data type is preferably a 64-bit unsigned integer, accompanied by a delta-cycle counter. For example, such a data type might be defined as follows:

```
typedef struct {
    long int LowTime;
    long int HighTime;
    long int DeltaCycleCount;
} bpTimeT;
```

Another data type used in the proposed API is a void pointer (void *). This is used to address blocks of data whose format is known to the callee due to a previously received information.

Other data types used in the API, such as bpStatusT, can be derived from the types listed above.

Waveform Resolution API Function Calls; Coelaborator Function Calls

The following calls are made by the coelaborator when it interprets the data in the partition file during the elaboration phase. As a result of the elaboration, the solvers register the data relevant to the interconnection and ownership of the global nets. The solvers also register waveform data types on the global nets and external drivers of multiply driven nets.

bpRegisterGlobalNet
bpStatusT bpRegisterGlobalNet(
 bpStringT NetIdentifier,
 bpIntegerT NetHandle,
 bpIntegerT NetOwnerId,
 bpIntegerT NetDataTypeCode)

A call to this function informs a solver that one of its nets (NetIdentifier is known to the solver) is a global net. The solver must register the net handle, net owner and waveform data type. If the solver is told to own that net, it will later be asked by the synchronizer to submit the resolved waveform values.

bpRegisterRemoteDriver
bpStatusT bpRegisterRemoteDriver(
 bpObjectIdentT DriverTypeIdentifierAndAttributes,
 bpStringT DriverInstanceIdentifier, bpIntegerT DriverHandle,
bpIntegerT DriverOwnerId,
bpIntegerT NetHandle)

The owner of a previously registered global net specified by NetHandle will receive calls to this function in order to register all remote drivers contributing to this net. The called solver has the option to rebuild the model of this driver, if it finds it appropriate.

Waveform Resolution API Function Calls; Synchronizer Function Calls

These calls are made at simulation time. Prior to proceeding to another time point, the solvers will be called by the synchronizer to send and receive waveforms and events on global nets.

bpSendWaveform
bpStatusT bpSendWaveformT(
    bpIntegerT NetHandle,
    bpTimeT StartTime,
    bpTimeT EndTime)

When a call to this function is made, the called solver must reply with a call to the function ssReceiveWaveform, where it submits the requested waveform.

bpReceiveWaveform
bpStatusT bpReceiveWaveform(
    bpIntegerT NetHandle,
    bpTimeT StartTime,
    bpTimeT EndTime,
    void *WaveformData)

This call is made after the owner of a global net has resolved its waveform and submitted it to the backplane. The waveform is made available to the called solver by the pointer WaveformData.

bpSendEvent
bpStatusT bpSendEvent(
    bpIntegerT NetHandle)

This function is similar to the function bpSendWaveform. The called solver (who owns and resolves the net denoted by NetHandle) must reply with a call to ssReceiveEvent, in order to submit the requested event.

bpReceiveEvent
bpStatusT bpReceiveEvent(
    bpIntegerT NetHandle,
    bpTimeT EventTime,
    void *EventData)

This function is used to broadcast an event to the receiving solvers after the event was submitted by the owner.

bpSendRemoteDriver
bpStatusT bpSendRemoteDriver(
    bpIntegerT DriverHandle)

This function is similar to the functions bpSendWaveform and bpSendEvent. The called solver must reply with a call to ssReceiveRemoteDriver and submit the driver attributes.

bpReceiveRemoteDriver
bpStatusT bpReceiveRemoteDriver(
    bpIntegerT DriverHandle,
    bpTimeT CurrentTime,
    void *DriverData)

The solver owning the net to which the driver is connected will receive a call to this function when the attributes of the drivers become available. The solver can then use the driver data to resolve the net.

Waveform Resolution API Function Calls; Solver Function Calls

The following calls are made by the solvers to the backplane when they are asked to submit waveforms or events on the global nets they own. According to a vendor-specific backplane implementation, the calls can be redirected by the backplane to the receiving solvers. Alternatively, the backplane may store the submitted waveforms and then broadcast them to the solvers using, for example, separate IPC messages.

ssReceiveWaveform
ssStatusT ssReceiveWaveform(
    bpIntegerT NetHandle,
    bpTimeT StartTime,
    bpTimeT EndTime,
    void *WaveformData)

Calls to this function are made in reply to a backplane call to bpSendWaveform.

ssReceiveEvent
ssStatusT ssReceiveEvent(
    bpIntegerT NetHandle,
    bpTimeT EventTime,
    void *EventData)

Calls to this function are made in reply to a backplane call to bpSendEvent.

ssReceiveRemoteDriver
ssStatusT ssReceiveRemoteDriver(
    bpIntegerT DriverHandle,
    bpTimeT CurrentTime,
    void *DriverData)

Calls to this function are made in reply to a backplane call to bpSendRemoteDriver. The solver receiving such a call owns the driver, but it does not own the global net to which the driver is contributing.

ssErrorStatusReport
ssStatusT ssErrorStatusReport(
    bpErrorT ErrorStatus)

Calls to ssErrorStatusReport notify the backplane about transmission errors, inability to provide the requested information, failure to resolve nets due to incompatible waveform values, numerical problems and so on.

Finally, error codes may also be devised, to handle typical error situations.

SUMMARY AND CONCLUSION

Using the foregoing specification, the invention may be implemented using standard programming and/or engineering techniques using computer programming software, firmware, hardware or any combination or subcombination thereof. Any such resulting program(s), having computer readable program code means, may be embodied or provided within one or more computer readable or usable media such as fixed (hard) drives, disk, diskettes, optical disks, magnetic tape, semiconductor memories such as read-only memory (ROM), etc., or any transmitting/receiving medium such as the Internet or other communication network or link, thereby making a computer program product, i.e., an article of manufacture, according to the invention. The article of manufacture containing the computer programming code may be made and/or used by executing the code directly from one medium, by copying the code from one medium to another medium, or by transmitting the code over a network.

An apparatus for making, using, or selling the invention may be one or more processing systems including, but not limited to, a central processing unit (CPU), memory, storage devices, communication links, communication devices, servers, I/O devices, or any subcomponents or individual parts of one or more processing systems, including software, firmware, hardware or any combination or subcombination thereof, which embody the invention as set forth in the claims.

User input may be received from the keyboard, mouse, pen, voice, touch screen, or any other means by which a human can input data to a computer, including through other programs such as application programs.

One skilled in the art of computer science will easily be able to combine the software created as described with appropriate general purpose or special purpose computer hardware to create a computer system and/or computer subcomponents embodying the invention and to create a computer system and/or computer subcomponents for carrying out the method of the invention. While the preferred embodiment of the present invention has been illustrated in detail, it should be apparent that modifications and adaptations to that embodiment may occur to one skilled in the art without departing from the spirit or scope of the present invention as set forth in the following claims.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A multitasking system for simulation of the behavior of an electronic circuit, the system comprising:

means for partitioning the electronic circuit to be simulated into portions;

an interface module having a standard interface for coupling with active components and for controlling communication between different ones of the active components, the communication being performed using block waveform relaxation; and a plurality of active components coupled to the interface module, each of the active components including a simulator module having (i) means for performing a simulation of a respective one of the portions of the circuit to be simulated, and (ii) means for communicating inter-process status, including retro-events generated by another simulator module of the plurality of active components, between the simulator modules by block wave form relaxation, each of the means for performing a simulation comprising either a backtracking simulator or a non-backtracking simulator, wherein the interface module prohibiting a non-backtracking simulator from running beyond an earliest time that a retro-event can occur.

2. A system as recited in claim 1, wherein the interface module includes a physical backplane.

3. A system as recited in claim 1, wherein each of the active components includes a simulator module having a central processing unit (CPU).

4. A system as recited in claim 3, wherein each of the simulator modules further includes a program store containing block waveform relaxation code for execution by the CPU.

5. A system as recited in claim 3, wherein each simulator module further includes a computer software simulation model of the respective portion of the circuit to be simulated, the simulation model being given in terms of equations that describe the respective portion of the circuit to be simulated.

6. A system as recited in claim 5, wherein each simulator module further includes a SPICE-like solver for solving the equations using a direct method.

7. A system as recited in claim 5, wherein each simulator module further includes a SPICE-like solver for solving the equations, by means of a block relaxation method, using the block waveform relaxation code.

8. A system as recited in claim 4, wherein the program store further contains program code means for communicating with other simulation modules through the backplane.

9. A system as recited in claim 8, wherein the program code means for communicating includes means for executing a parallel Gauss-Jacobi waveform Newton (PGJWN) algorithm.

10. A system as recited in claim 9, wherein the program code means for communicating further includes means for exchanging inter-process communication (IPC) messages with other simulation modules.

11. A system as recited in claim 4, wherein each of the simulator modules further includes a program store containing program code for directing the simulator module to:

initialize a relaxation iteration index to an initial value;

initialize waveforms to be simulated, to initial guess values; and iteratively execute a parallel Gauss-Jacobi waveform Newton (PGJWN) iteration loop until a predetermined condition is satisfied.

12. A system as recited in claim 11, wherein, in the step of iteratively executing a PGJWN iteration loop, calculations are performed, including one of:

(i) a direct method, (ii) an LU factorization method, (iii) a Gauss elimination method, and (iv) a local relaxation method.

13. A system as recited in claim 11, wherein the program store further contains program code for directing the simulator module to generate a retro-event, and to propagate the retro-event to other simulator modules.

14. The multitasking system of claim 1 wherein the interface module allows a backtracking module to backtrack to the time of the retro-event and re-run the simulation.

* * * * *